United States Patent [19]

Nissan-Cohen et al.

[11] Patent Number: 4,895,780

[45] Date of Patent: Jan. 23, 1990

[54] ADJUSTABLE WINDAGE METHOD AND MASK FOR CORRECTION OF PROXIMITY EFFECT IN SUBMICRON PHOTOLITHOGRAPHY

[75] Inventors: Yoav Nissan-Cohen, Schenectady; Paul A. Frank, Albany; Joseph M. Pimbley; Dale M. Brown, both of Schenectady; Ernest W. Balch, Ballston Spa; Kenneth J. Polasko, Latham, all of N.Y.

[73] Assignee: General Electric Company, Schenectady, N.Y.

[21] Appl. No.: 265,285

[22] Filed: Oct. 25, 1988

Related U.S. Application Data

[63] Continuation of Ser. No. 49,744, May 13, 1987, abandoned.

[51] Int. Cl.⁴ ............................................. G03F 1/00
[52] U.S. Cl. ......................................... 430/5; 378/35; 364/474.24
[58] Field of Search .......................... 430/5, 296, 321; 378/35; 428/432; 364/468, 474.24

[56] References Cited

U.S. PATENT DOCUMENTS 4,591,540  5/1986  Bohlen et al. ........................ 430/22

OTHER PUBLICATIONS

"Calculation of Changes in Pattern Dimensions to Compensate for Proximity Effects in Electron Lithography", Mihir Parikh, IBM Research Lab., San Jose, Ca.-J. Appl. Physics, Jan. 1980, pp. 705-709.

"Control of Pattern Dimensions in Electron Lithography", H. Sewell-Philips Res. Labs., Redhill, Surrey, England,-J. Vac. Sci. Technol, 15 (3, May/Jun. 1978—pp. 927-927-930.

"Proximity Effect Correction for Electron Beam Lithography by Equalization of Background Dose'-'—Geraint Owen & Paul Rissman, Hewlett-Packard Labs., Palo Alt, CA—J. Appl. Phys. 54(6), Jun. 1983, pp. 3573-3581.

Primary Examiner—Jose G. Dees
Attorney, Agent, or Firm—Robert Ochis; James C. Davis, Jr.; Marvin Snyder

[57] ABSTRACT

In order to solve the problem of the proximity effects which occurs in the fabrication of integrated circuit devices, a facile method is provided for automatically creating a new pattern in which variably spaced windage correction is applied over the mask. This permits the utilization of conventional design fabrication rules and systems without the concomitant problem of producing small feature sizes in isolated structures. The method produces highly desirable chip masks and is readily implemented on commercially available CAD systems presently being employed for the production of circuit masks. The method is automatic and extremely easily implemented.

11 Claims, 10 Drawing Sheets

SINGLE STEP WINDAGE

SINGLE STEP WINDAGE

ITERATIVE WINDAGE ADDITION

ADJUSTABLE WINDAGE METHOD AND MASK FOR CORRECTION OF PROXIMITY EFFECT IN SUBMICRON PHOTOLITHOGRAPHY

This application is a continuation of application Ser. No. 049,744, filed May 13, 1987, now abandoned.

The present invention is generally directed to a mask and a method for its production. In particular, the masks referred to herein are masks used in the fabrication of integrated circuit devices, particularly those devices exhibiting submicron features although the present invention is not limited thereto. Even more particularly, the present invention relates to the correction of the proximity effect in photolithography masks through the use of variable windage in a circuit fabrication mask.

Over the last 20 years, researchers in the field of integrated circuit manufacture have sought to reduce the geometrical size of features present on an integrated circuit device. This is particularly seen to be true in the manufacture of memory and microprocessor devices, though this search has certainly not been limited to these devices. The search has sought to package greater and greater numbers of devices on an integrated circuit, chiefly by shrinking individual device sizes.

The manufacture of integrated circuit devices has necessarily employed the use of masks. At present, these masks typically comprise transparent substrates on which various patterns are disposed. These masks are employed to selectively expose resist material to certain radiation. Selectivity is controlled by mask patterning. In general, the shorter the wavelength of the radiation, the finer is the feature size that may be resolved with a given mask. In particular, many present day processes employ masks which selectively pass visible, ultraviolet, or even x-ray radiation. While the present invention is primarily directed to extending the capabilities of photolithographic methods, it is recognized that the devices and methods described herein are equally applicable to other forms of radiation, the only requirements being that the mask patterns are opaque to the radiation and that the radiation can be employed to selectively affect material disposed on the substrate, such as a photoresist.

However, there is a problem inherent in the utilization of photomasks. In particular, this problem is referred to as the proximity effect. The result of this effect is that if features in dense structures are resolved to their exact size, isolated features tend to be over exposed. This problem imposes significant reliability concerns which are related to the undersizing of dimensions such as transistor gate length, metal line width and the sizes of other isolated features. A method to correct this effect is needed to aid the extension of photolithographic methods into the submicron range.

In other mask preparation methods, mask patterns are employed either as they are designed (the so-called base pattern) or they are employed with a constant global "windage". As used herein and in the appended claims, the term windage refers to a bias, adjustment or correction made to base mask patterns. Global windage correction patterning is performed and is effective as a correction for process effects which do not depend on feature size, such as the encroachment of field oxide into active area regions. No correction for the proximity effect is presently performed or carried out in the manufacture of masks for use in integrated circuit fabrication. Thus, when process parameters such as exposure time and etching conditions are tuned so as to resolve small spaces, as between adjacent conductors, large spaces are generally oversized. The implication of oversized spaces is that isolated lines or patterns on the chip are undersized as compared to lines present in dense or closely packed structures on the chip.

It is noted that computer aided design (CAD) machines currently exist and are commercially available for the generation of masks for use in integrated circuit manufacture. A particular example of such a machine is the Standard Model of the Fast Mask Engine as manufactured by Silicon Solutions Corp. These machines are commercially available and are capable of performing Boolean operations and global windage additions and subtractions.

SUMMARY OF THE INVENTION

In accordance with a preferred embodiment of the present invention, a mask for use in the manufacture of integrated circuit devices comprises a transparent substrate which has a plurality of base patterns disposed on the substrate. These patterns are opaque to at least one form of radiation. Most importantly, for the purposes of the present invention, these base patterns have variable windage patterns disposed adjacent to the base patterns so that windage patterns of greater width are employed in mask regions in which the spacing of said base patterns is greater than that in other regions of the mask.

In accordance with another embodiment of the present invention, a method for the manufacture of integrated circuit masks comprises a sequence of steps, the first of which is the storage of a representation of a base pattern. The base pattern representations are adjusted by adding a global windage correction pattern to the base pattern. Most importantly, with respect to the practice of the present invention, the globally adjusted pattern representations are further adjusted by removing a width N from the periphery of the pattern representations for pattern spaces less than M in width so as to produce a variable windage pattern representation. A mask is then produced from this variable windage pattern representation. In another embodiment of the present invention, a computer automated design (CAD) machine is operated in accordance with the present invention to produce the desired variable windage adjusted mask. Thus, a mask which counteracts the proximity effect is produced.

In a preferred embodiment of the present invention, a CAD machine is made to operate in accordance with certain algebraically specified geometric formulations to produce the desired pattern. Typically, these manipulations represent relatively primitive functions for such machines and the equations presented herein (and described more particularly below) are readily implemented by operators of these machines so as to produce the desired variably adjusted windage corrected mask patterns.

It is also noted that the procedures provided in the present invention may be applied iteratively. This is particularly desirable for fine tuning the results produced by the present method. It is also noted that while the present invention is particularly directed to photolithography and to submicron sized works, the method is also applicable to the production of circuit chips having larger feature sizes and their corresponding masks. It is also applicable to other forms of radiation than visible and ultraviolet electromagnetic radiation.

Accordingly, it is an object of the present invention to produce masks for integrated circuit manufacture which are corrected for the proximity effect.

It is also an object of the present invention to provide a method for producing integrated circuit masks which are particularly useful for extending photolithographic methods of chip production into the submicron range.

It is a still further object of the present invention to provide an easily implemented procedure usable on commercially available mask design equipment which can produce corrected patterns without redesign of the overall chip mask, that is, without redesign of the base patterns.

It is also an object of the present invention to correct for the proximity effect on the mask level by introducing adjustable windage corrections so that isolated features are not undersized.

It is yet another object of the present invention to perform an automatic windage correction by means of generic manipulation of the masks via their internal machine representations prior to generation of computer tapes from which the masks themselves are generated.

It is a still further object of the present invention to generally enhance lithographic applications, including those carried out by x-ray and electron beam exposure.

Lastly, but not limited hereto, it is an object of the present invention to provide an iterative procedure for proximity effect correction.

DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
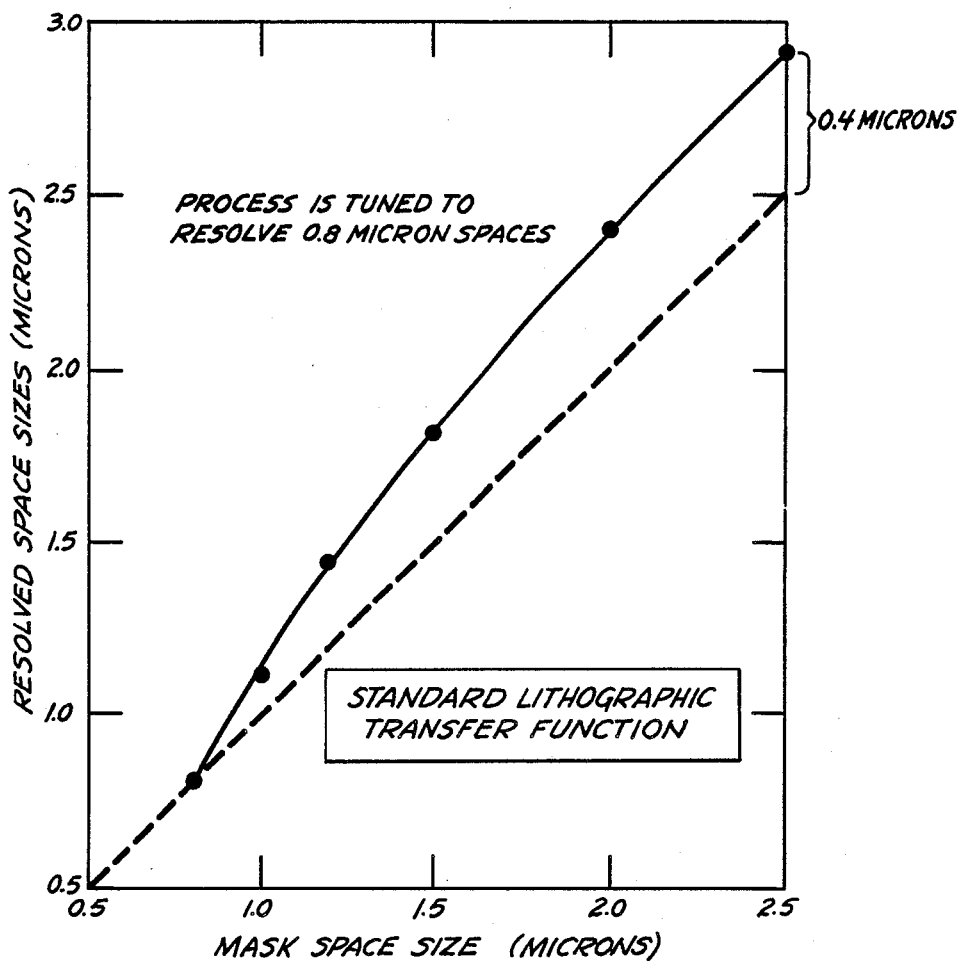
FIG. 1 is a graph illustrating the standard lithographic transfer function indicating the variation of resolved space size as a function of mask space size.

As indicated above, FIG. 1 is a graph of the transfer function for the standard lithographic process which uses a mask which is not corrected for the proximity effect. In particular, the graph is a plot of resolved space size as a function of the mask space size. The graph shown is for a process which is tuned to resolve 0.8 micron spaces. It is possible also to tune the exposure so as to resolve smaller or larger feature sizes. In such cases, different transfer functions result. However, it is seen that a mask feature size of approximately twice that value, namely 1.5 microns, is not resolved into a feature size of 1.5 microns, but rather is resolved to a feature size which is greater, namely approximately 1.7 microns. It is also seen that as mask space size increases up to approximately 2.5 microns, there is a deviation from the ideal resolved space size of approximately 0.4 microns. The ideal is indicated by the dashed line in the figure. Actual resolved space size is indicated by the solid curved line and its associated data values indicated by filled in circular dots. It is particularly noted that the deviation illustrated in FIG. 1 is such that the solid line always lies above the ideal line, thus indicating that isolated features tend to have smaller actual resolved sizes because the spaces between such features is greater. It is to be borne in mind that the references in FIG. 1 are to spaces between features and not to the features themselves. It should also be seen that the advantages of the present invention may be appreciated by a comparison of FIG. 1 with FIG. 6 which is more particularly discussed and described below.

The method of the present invention is based upon an application of threshold windage addition steps. Typically, the steps are carried out iteratively. A threshold windage addition step is defined as follows: add a windage N per edge from all spaces larger than M, where N and M are parameters. In preferred embodiments of the present invention, particularly as carried out by a mask generating CAD system, a threshold windage addition is performed by Boolean (logical) operations and global windage additions and subtractions. These are standard operations in mask design machines such as referred to above. These operations can be seen in the sequence of result patterns shown in FIGS. 2a-2g. The operations referred to herein are carried out on specified base patterns. Typically, these base mask patterns are those generated as a part of conventional design processes for integrated circuits. These design masks may be produced as a result of operations carried out by software and hardware combinations referred to generically as silicon compilers, but are more often carried out by hand.

If one is given a specified (initial) mask pattern, referred to herein symbolically by a symbol such as A, one may specify a geometric operation in which a border of a particular size is added to the base pattern. In more familiar terms, this would be analogous to a country's establishing a 50 or 100 mile boundary for enforcing, say fishing rights. Algebraically, such an operation is denoted herein symbolically by A+m. It is also noted that a border of a particular width may be removed from a particular pattern or set of patterns. This is denoted herein symbolically by the expression A−m. Specific illustrations of these operations are discussed below in conjunction with FIGS. 2a-2g. It is noted that algebraic expressions are being used herein to indicate certain geometric operations. However, it should also be remarked that it is important to note that the algebra described herein is not conventional. In particular, if one adds a border of size m and then subtracts a border of size m, one does not necessarily produce the original starting pattern. In particular, it is noted that the expression (A+m)−m is not the same as the expression A alone. This point is also illustrated below in FIG. 2. Lastly, for the purposes herein, the Boolean operation "andnot" is used to indicate an operation in which the second operand, that is, the operand occurring on the righthand side of the "andnot" operator is geometrically subtracted from the pattern specified by the first operand. This also is illustrated below in FIG. 2.

In accordance with a preferred embodiment of the present invention, variable windage correction is achieved by generating a modified mask pattern A' in accordance with the following equation:

$$A' = (A+n)\text{andnot}\{[[((A+m)-m)\text{andnot } A]+n]\text{andnot } A\} \quad \text{(Eq. 1)}$$

The effect of this equation is illustrated in the sequence of base patterns shown in FIGS. 2a-2g (referred to collectively herein as FIG. 2). As indicated above, a threshold windage addition step in accordance with the present invention, adds a windage N per edge from all spaces larger than M. In the equation specified above, n=N and m=M/2. In the equation specified above, it should also be noted that A represents the original or initial mask pattern, that is the base mask pattern; A' represents the variably adjusted or variably biased (modified) mask, as corrected to account for the proximity effect. As indicated above, it is noted that N and M are parameters for the method of the present invention. It is also indicated that the process steps indicated herein may be carried out iteratively and that it is not necessary that the parameters N and M remain constant from one iteration to the next.

Figure 2A:
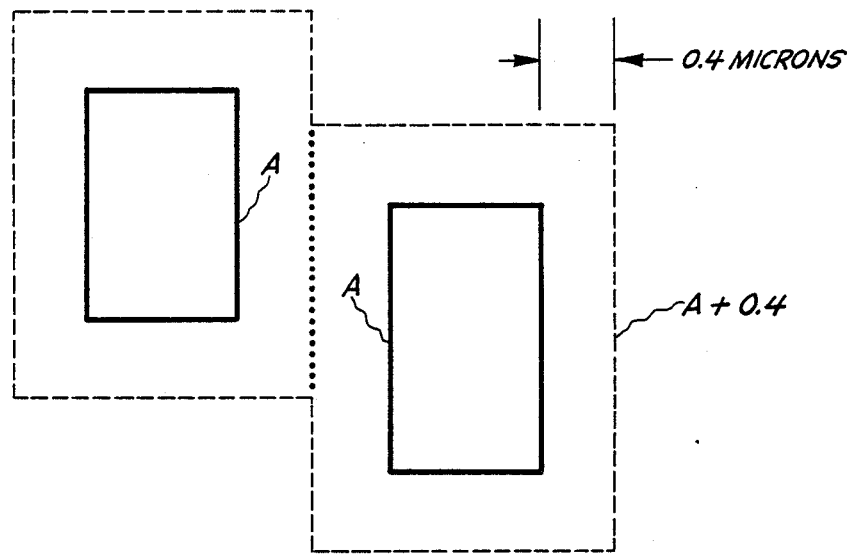
FIGS. 2a-2g illustrate various stages in the algebraic/geometric manipulation of a sample base pattern in accordance with a preferred embodiment of the present invention.
Figure 2B:
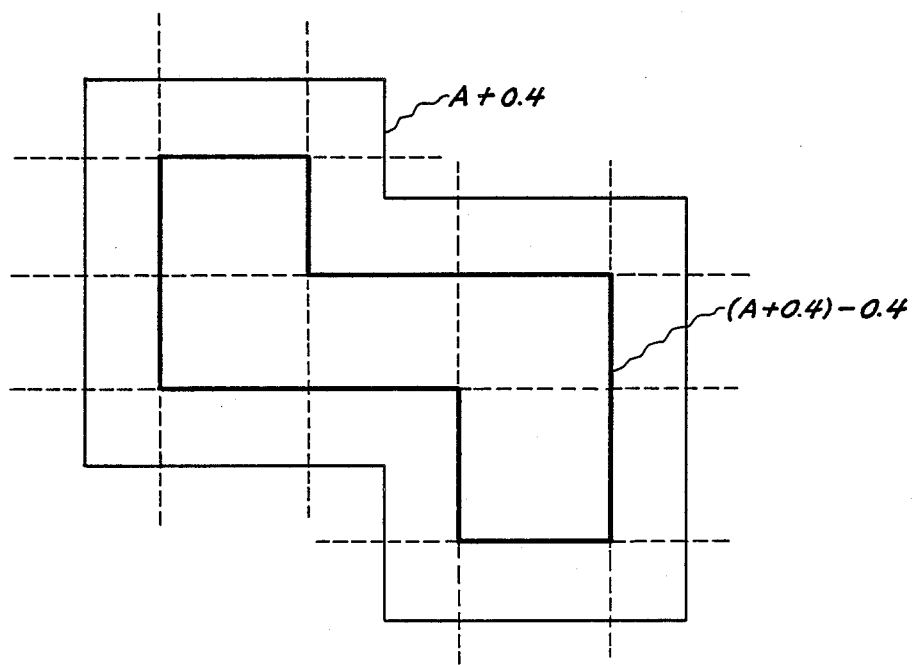

Attention is now specifically directed to illustrating the function carried out by the operations illustrated in Equation 1 above. These are illustrated in FIG. 2. In particular, it is noted that in FIG. 2, N is chosen to be 0.2 microns and M is chosen to be 0.8 microns thus implying that m represents a border of 0.4 microns in width. The base pattern A is illustrated in FIG. 2a. It is noted that the pattern A includes disjointed segments. The operation A+m or more particularly A+0.4, is also shown in FIG. 2a. This latter geometric structure is shown with dashed lines. Note that the addition results in a merger of two, formerly separate geometric areas. This is not in any way a problem. Next, as suggested by Equation 1 above, the operation (A+m)−m is performed. This operation is illustrated in FIG. 2b. It is noted that the starting point for the subtraction operation is the pattern designated by a single solid line as A+0.4 in FIG. 2b. The dashed lines are employed therein to indicate the "lopping off" or removal of a 0.4 micron border along each edge of the A+0.4 pattern. The resulting pattern is shown as a heavy line and is designated in FIG. 2b as (A+0.4)−0.4. Note that the resulting geometric pattern (A+0.4)−0.4 is not the same as the pattern A shown in FIG. 2a.

Figure 2C:
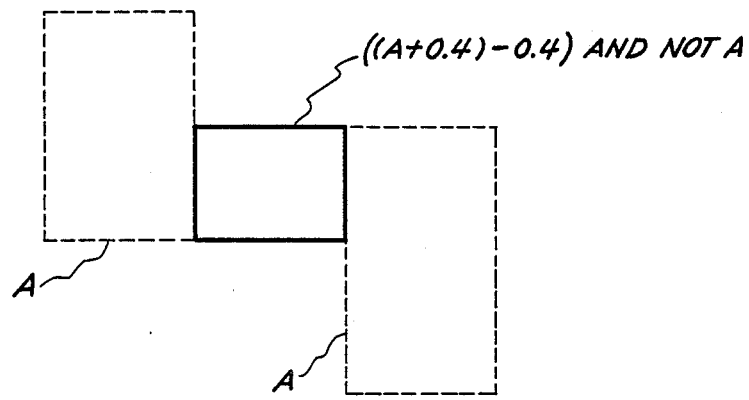

As further implied by the operational order suggested by the parenthetical type delimiters shown in equation 1, the "andnot" operation is carried out next. This is illustrated in FIG. 2c. This figure illustrates the subtraction of the original pattern A from the result illustrated in FIG. 2b (the heavy pattern therein). In particular, FIG. 2c illustrates this result which is designated by a solid line in FIG. 2c and is labeled as ((A+0.4)−0.4 andnot A.

Figure 2D:
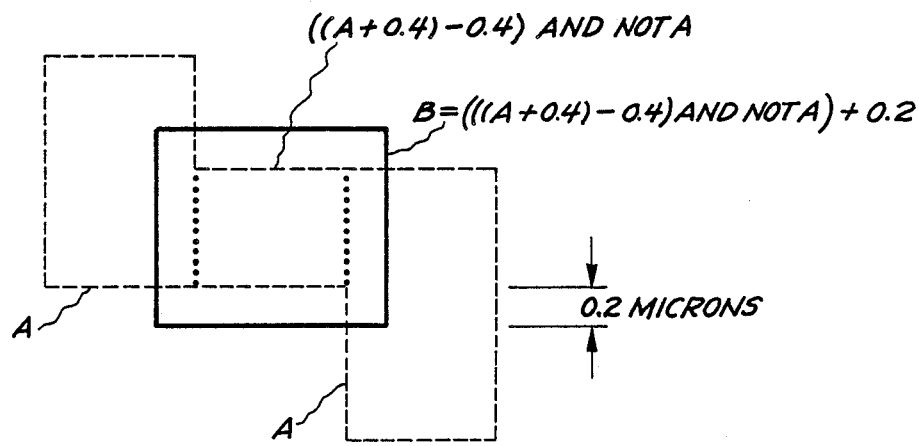
Figure 2E:
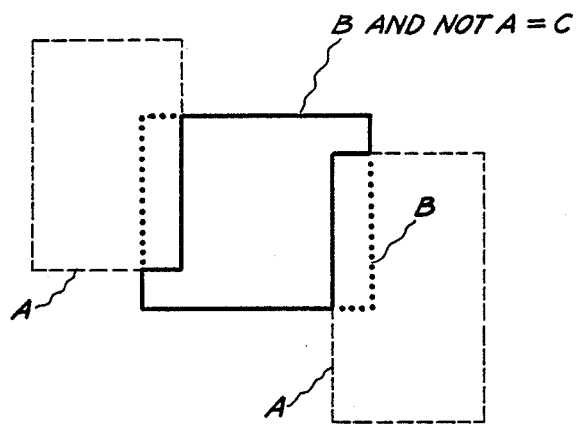
Figure 2F:
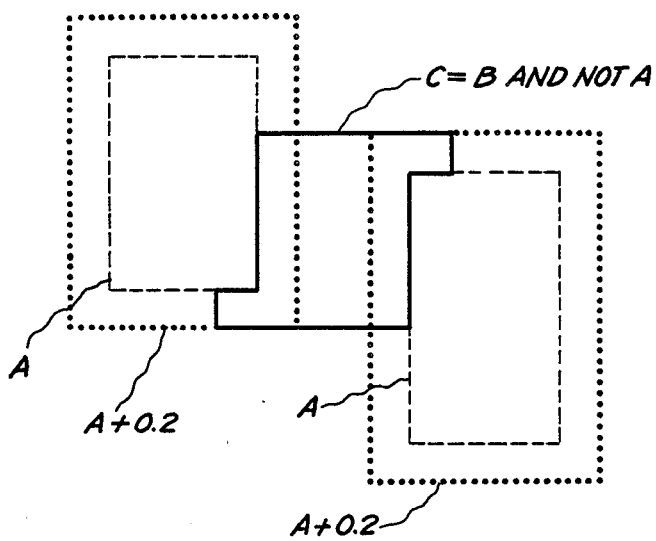

As further suggested by Equation 1, the next operation is an addition operation in which a border of width n is added. This is illustrated in FIG. 2d for the case in which a 0.2 micron border is added to the rectangular area shown in FIG. 2c. This results in the rectangular area denoted by B in FIG. 2d. In particular, it is seen that $B = (((A+0.4)-0.4)\text{andnot } A)+0.2$. The label B is employed herein solely for convenience. Accordingly, with this convention, it is seen that equation 1 now calls for the construction of the pattern B andnot A. This latter geometric figure is referred to herein as C which is more particularly illustrated in FIG. 2e. In other words, the region C includes all of that area which is in region B and not in the original pattern A. The result C is illustrated in FIG. 2e with a solid line. Other regions are indicated in FIG. 2e with either dashed or dotted lines, as shown. Thus, region C is essentially a rectangular region with two diagonally opposite tab-like extensions, as shown.

Figure 2G:
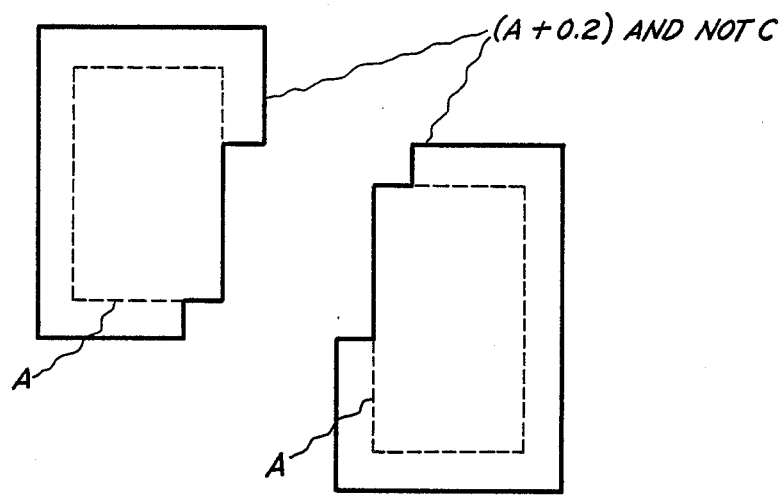

Next, equation 1 calls for the generation of the pattern A+n. Note here that in previously performed operations on the base pattern A, the parameter m was employed. Here, a border of size 0.2 microns is added to the original pattern. The geometric pattern that results is shown as a dotted line designated A+0.2 in FIG. 2f. The original pattern is shown therein as a dashed line, designated A. Region C from FIG. 2e is shown as a solid line. The last operation called for by Equation 1 is the formation of the region (A+n) andnot C. This final result is illustrated in FIG. 2g. For comparison purposes, the original starting pattern A is also shown therein as a dashed line. The desired result is then shown as a solid line.

Several things are worthy of note in FIG. 2g. In particular, it is seen that a windage correction has been added to the base pattern A. This is accomplished through the A+n operation (a global correction). Portions of base pattern which abut open spaced areas possess corrected patterns of width n. However, in the region between the two separate portions of base pattern A, material has been removed from the edges. This is accomplished using the andnot operator with a righthand operand C, as above. Thus, what would normally be a windage correction n extending between the separate patterns in pattern A, has been subtracted. This is the desired result. It is noted that the function achieved by Equation 1 could be carried out again on the pattern shown in FIG. 2g. Thus, the method of the present invention may be employed iteratively, though it is not always required that iterative applications be performed. It is further noted that these iterative operations do not have to be carried out with the same N and M parameters. It should also be appreciated that FIG. 2 represents a relatively simplistic pattern and is provided herein primarily for purposes of understanding the operation of the present method and the results achievable by this method for a simple base pattern. Its extension to more complex patterns is illustrated more particularly below.

It is noted that the proximity correction method of the present invention is not limited to the use of Equation 1 provided above. Proximity correction can also be realized with similar methods. An alternative embodiment of the present invention is expressed by the following equation:

$$A' = \{[(A+m)-m]+n\}\text{andnot}[[(A+m)-m]\text{andnot } A] \quad \text{(Eq. 2)}$$

Figure 3A:
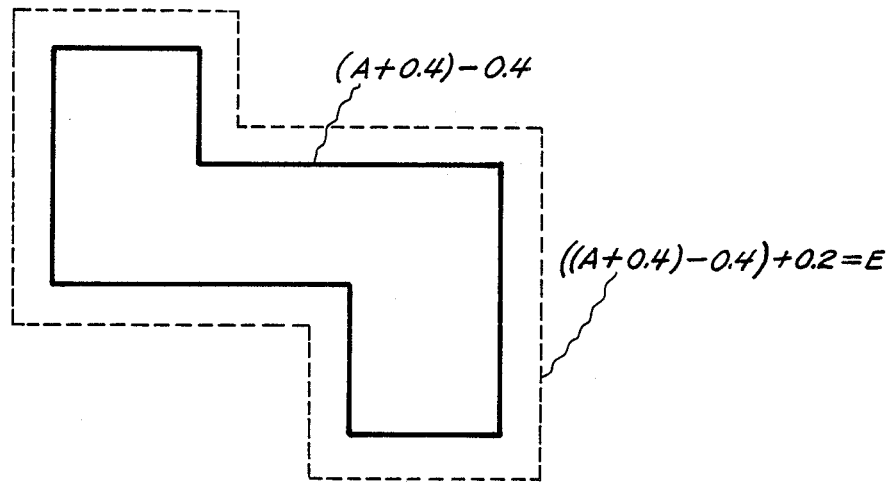
FIGS. 3a-3d illustrate an alternate implementation of the present invention.
Figure 3B:
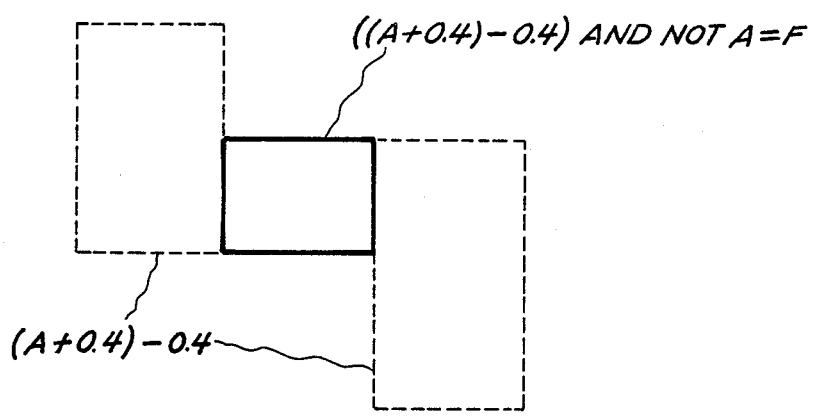
Figure 3C:
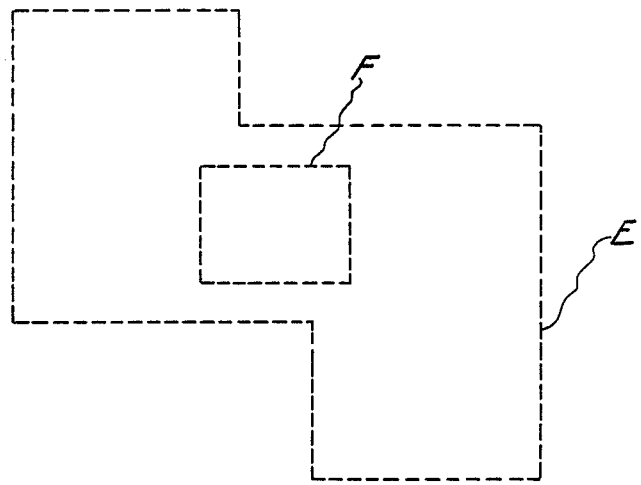
Figure 3D:
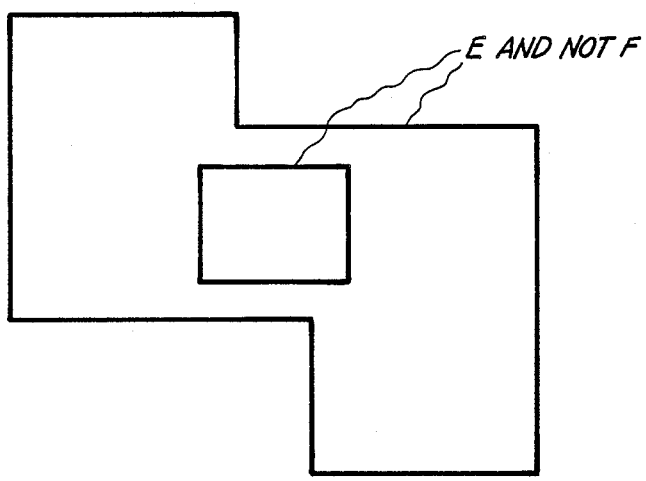

The results obtained by carrying out the various operations indicated in Equation 2 are shown for the same base pattern A as used above with respect to FIG. 2. Additionally, the same parameters are employed. In particular, it is seen that the dashed geometric shape designated by E in FIG. 3a represents the result of forming $((A0.4)-0.4)+0.2$. Similarly, the rectangular area denoted by solid line F in FIG. 3b illustrates the result of forming $((A+0.4)-0.4)$ andnot A. Expressed in this fashion, Equation 2 could also be written as $A'=E$ andnot F. These final results are illustrated in FIGS. 3c and 3d. It is noted that FIG. 3d indicates the existence of two bridges extending between the formerly separate portions of pattern A. However, the existence of these bridges is not a particularly significant problem in this latter implementation in that it is seen that the width of the bridges is 0.2 microns. With most present day photolithography systems, features of this small size are not resolvable anyway, so that the existence of the bridge does not affect the final product in any significant way. However, Equation 2 is illustrative of the fact that other methods for windage correction are possible and are embodied in the generic description of the present invention.

Figure 4:
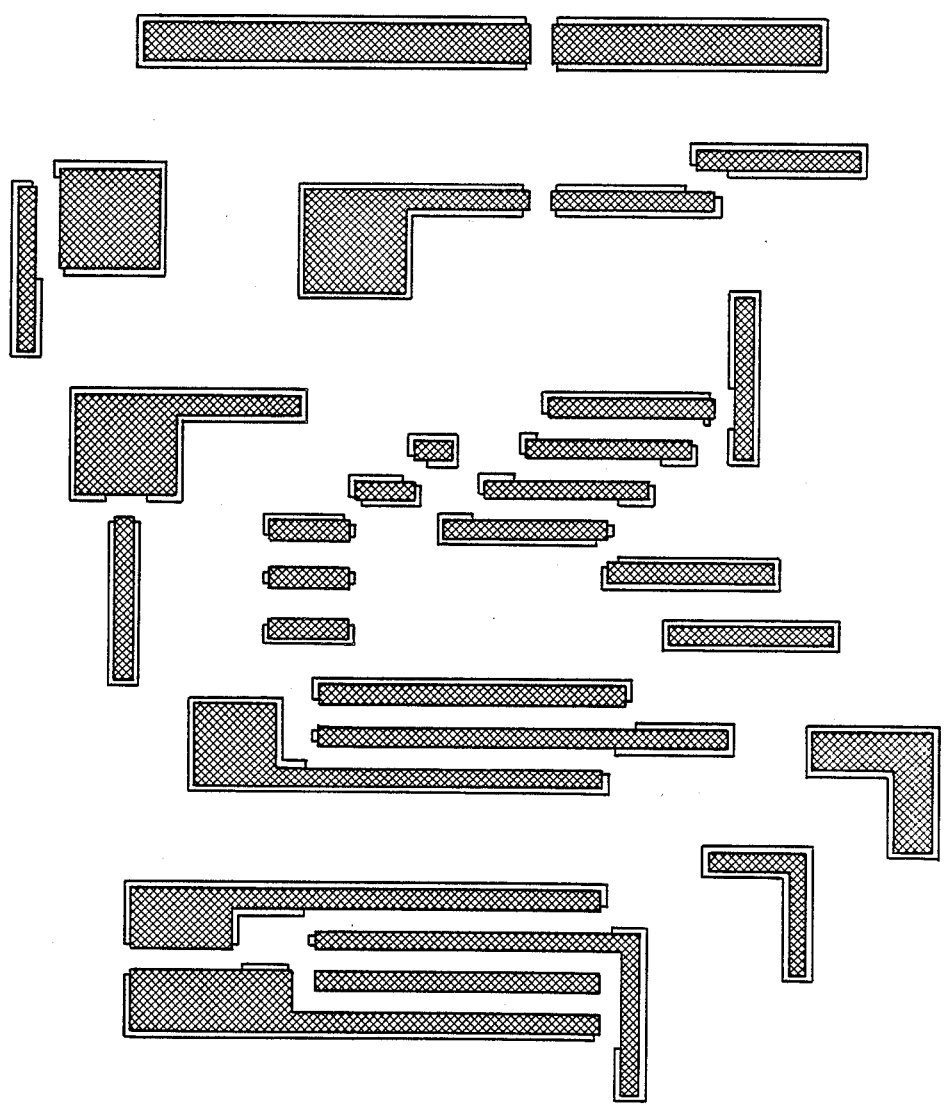
FIG. 4 illustrates the application of a single iteration of the present invention to a more complicated base pattern.
Figure 5:
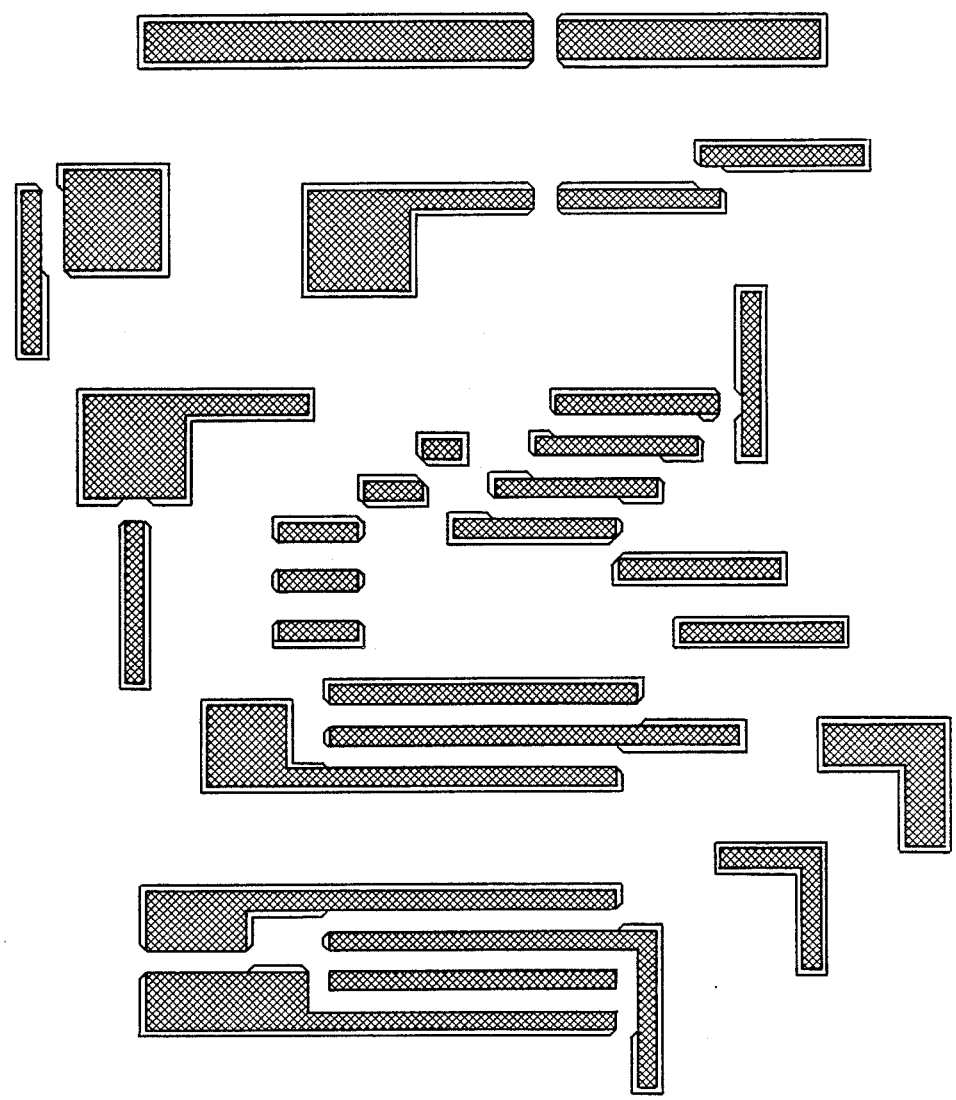
FIG. 5 is similar to FIG. 4 but more particularly illustrates the effects of a four step iterative procedure in accordance with the present invention.

The results of applying, for one iteration, the method of the present invention is even more particularly illustrated in FIG. 4. This figure is particularly relevant in that a more realistic base pattern is shown. In particular, the base pattern portion is shown as a doubly cross hatched region in FIG. 4. The open regions surrounding the cross hatched patterns represent the variable windage correction added in accordance with the present invention. It is seen that isolated structures are provided with the same degree of windage correction that is applied in a global correction method. However, it is seen that densely packed structures and regions exhibit reduced windage correction. For the method illustrated in FIG. 4, it is noted that $M=0.6$ microns and $N=0.2$ microns. With an iterative application of the present method, and in particular with an iterative method which varies the values of M and N, a more refined modified pattern results. Such a pattern is shown in FIG. 5.

As indicated above, it is seen that the process of the present invention may be repeated with different values of the parameters N and M. The results of repeated application of the process steps of the present invention produces results summarized in Table I below. In this table, subscripts $1, 2, \ldots, k$ are provided to indicate the iteration number. Table I follows:

TABLE I

| Spaces From: | To: | Result |
|---|---|---|
| O | $M_1$ | are not changed |
| $M_1$ | $M_2 + 2N_1$ | are shrunk by $N_1$ per edge |
| $M_2 + 2N_1$ | $M_3 + 2(N_1 + N_2)$ | are shrunk by $N_1 + N_2$ per edge |
| . | . | . |
| . | . | . |
| . | . | . |
| $M_k + 2S_{k-1}$ | $M_{k+1} + 2S_k$ | are shrunk by $S_k$ per edge | where $S_k = N_1 + N_2 + \ldots + N_k = \sum_{i=1}^{k} N_i$

From the above, it is clear that the parameters M and N do not have to comprise the same numbers from one iteration to the next. In particular, it is preferable that they be varied. For example, Table II provided below, indicates a typical variation in the M parameter. Table II follows:

TABLE II

| k | $M_k$ | $N_k$ |
|---|---|---|
| 1 | 0.45 | 0.05 |

TABLE II-continued

| k | $M_k$ | $N_k$ |
|---|---|---|
| 2 | 0.50 | 0.05 |
| 3 | 0.60 | 0.05 |
| 4 | 0.70 | 0.05 |

Figure 6:
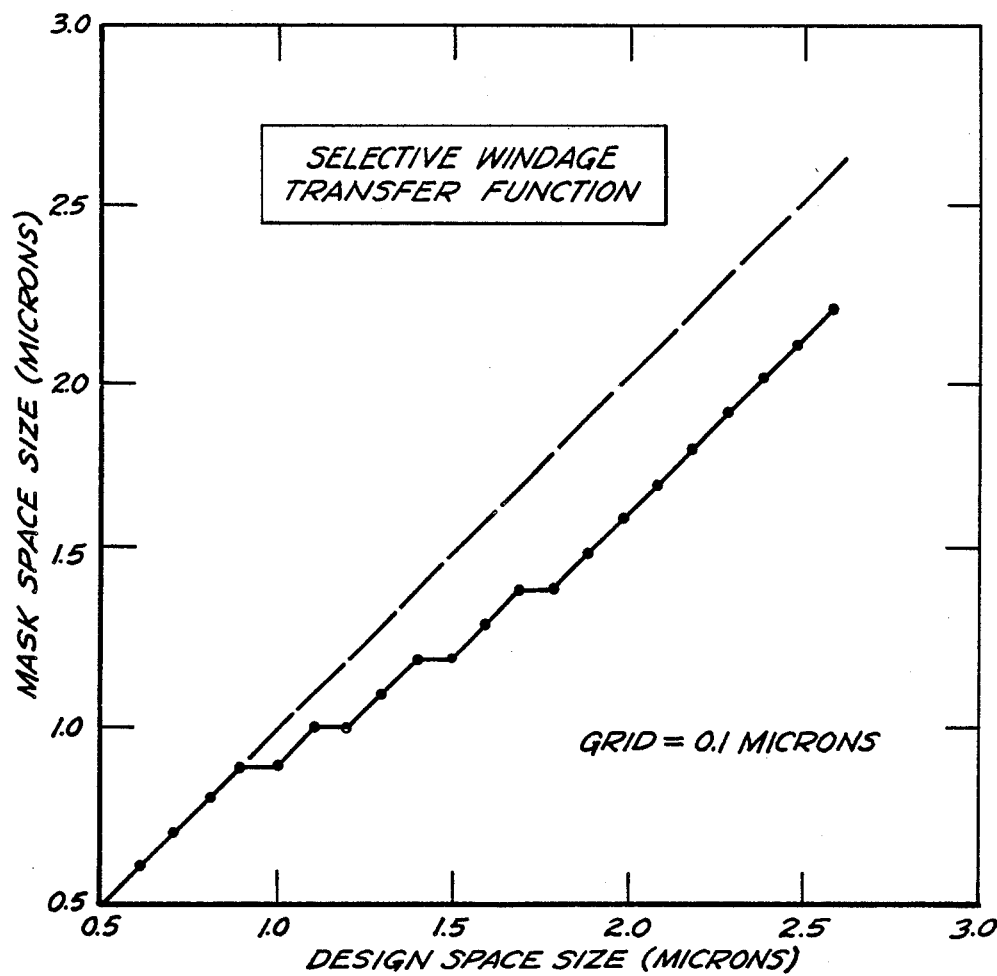
FIG. 6 is a graph similar to FIG. 1 but more particularly illustrating the transfer function for the selective windage situation described by the present invention.

If the parameters specified in Table II are successively employed, then the design space size is converted to a mask space size as indicated by the selective windage transfer function shown in FIG. 6. It is noted that the transfer function shown in FIG. 6 is such that it very closely compensates for the non-ideal characteristics of the lithographic transfer function shown in FIG. 1. It should not be assumed from FIG. 6, however, that correction for proximity effects below 0.8 microns is not desirable. In the event that the process is tuned to a different minimum feature size, it is noted that a different transfer function results.

It is noted that the masks employed herein typically comprise a material such as glass or quartz upon which the desired patterns are disposed. These patterns typically comprise a metal such as chromium. Such patterns are opaque, typically to both visible wavelength and to ultraviolet electromagnetic radiation. In appropriate circumstances, they are also opaque to x-ray and electron beam radiation. It is also noted that when electron beam radiation is used for patterning, the creation of a physical mask is not necessary, but the method of the present invention is still nonetheless applicable. This latter aspect with respect to electron beam writing is also applicable to the use of lasers writing directly on a wafer.

Accordingly, from the above it is seen that the mask and methods for mask manufacture in the present invention provide a means for compensating for the proximity effect. It is also seen that the present invention provides a mechanism for extending photolithography production facilities so as to render them also applicable to the production of submicron VLSI circuits. It is further seen that the present invention accomplishes these ends in a facile and economic fashion readily understandable by those skilled in the art of chip mask design. It is further seen that the advantages of the present invention include the fact that conventional design methodologies do not have to be abandoned or modified to account for the proximity effect. A method of the present invention may be applied automatically to any given chip mask design. Accordingly, it is seen that the present invention fulfills all of the aforementioned objects.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

We claim:

1. A mask for use in the manufacture of integrated circuit devices, said mask comprising:
    a transparent substrate having a plurality of base patterns disposed thereon, said patterns being opaque to at least one form of radiation, said base patterns having similarly opaque variable windage patterns disposed adjacent thereto and continuous therewith, said windage patterns being of greater width along the sides of each of said base patterns where the space between adjacent base patterns is greater than a threshold M than they are where the space between adjacent base patterns is less than said threshold value M.

2. The mask of claim 1 in which said substrate comprises glass.

3. The mask of claim 1 in which said substrate comprises quartz.

4. The mask of claim 1 in which said patterns are opaque to visible wavelength or ultraviolet wavelength radiation.

5. The mask of claim 1 in which said patterns comprise metal.

6. The mask of claim 1 in which said base patterns comprise chromium.

7. A method for the manufacture of masks which are useful in the fabrication of integrated circuit devices, said method comprising the steps of:
storing an initial mask representation including an opaque base pattern, said mask including at least one pattern space between opaque portions of said base pattern less than M in width and at least one pattern space equal to or greater than M in width;
adjusting the borders of said base pattern as specified in said initial mask representation by adding an opaque global windage correction pattern to said base pattern;
removing a width N from said globally adjusted pattern for all pattern spaces in said initial mask representation less than M in width but not for pattern spaces in said initial mask representation equal to or greater than M in width so as to produce a modified mask representation including a variable windage pattern representation;
producing a mask from said modified mask representation in which said base pattern and said windage pattern are opaque to at least one form of radiation.

8. The method of claim 7 in which said adjusting and removal steps are carried out in accordance with the following equation:

$$A'=(A+n)\text{andnot}\{[[((A+m)-m)\text{andnot } A]+n]\text{andnot } A\},$$

where A is said initial mask representation, n is N, m is M/2 and A' is said modified mask representation.

9. The method of claim 8 in which said adjusting and removal steps are carried out repeatedly.

10. The method of claim 7 in which said adjusting and removal steps are carried out in accordance with the following equation:

$$A'=\{[(A+m)-m]+n\}\text{andnot}[[(A+m)-m]\text{andnot } A]$$

where A is said initial mask representation, n is N, m is M/2 and A' is said modified mask representation.

11. A method for operating a CAD system for the design of masks which are used in the fabrication of integrated circuit devices, said method comprising the steps of:
storing an initial mask representation including an opaque base pattern, said base pattern including at least one pattern space less than M in width and at least one pattern space equal to or greater than M in width;
adjusting the borders of said opaque base pattern as specified in said initial mask representation by adding an opaque global windage correction pattern to said base pattern; and
removing a width N from said globally adjusted pattern for all pattern spaces in said initial mask representation less than M in width but not for pattern spaces in said initial mask representation equal to or greater than M in width so as to produce a modified mask representation including a variable windage pattern.

* * * * *